United States Patent
Hauf

(10) Patent No.: US 9,593,733 B2
(45) Date of Patent: Mar. 14, 2017

(54) DAMPING ARRANGEMENT FOR DISSIPATING OSCILLATING ENERGY OF AN ELEMENT IN A SYSTEM, MORE PARTICULARLY IN A MICROLITHOGRAPHIC PROJECTION EXPOSURE APPARATUS

(71) Applicant: Carl Zeiss SMT GmbH, Oberkochen (DE)

(72) Inventor: Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 237 days.

(21) Appl. No.: 14/144,101

(22) Filed: Dec. 30, 2013

(65) Prior Publication Data

US 2014/0202812 A1 Jul. 24, 2014

Related U.S. Application Data

(63) Continuation of application No. PCT/EP2012/064857, filed on Jul. 30, 2012.
(Continued)

(30) Foreign Application Priority Data

Aug. 3, 2011 (DE) .................. 10 2011 080 318

(51) Int. Cl.
*F16F 15/03* (2006.01)
*F16F 7/10* (2006.01)
*G03F 7/20* (2006.01)

(52) U.S. Cl.
CPC ............ *F16F 7/1011* (2013.01); *G03F 7/709* (2013.01)

(58) Field of Classification Search
CPC ...... F16F 7/1011; F16F 7/1005; F16F 15/022; F16F 15/1442; G03F 7/709
(Continued)

(56) References Cited

U.S. PATENT DOCUMENTS 2,603,103 A * 7/1952 Sohon .................. F16F 15/31
192/21.5
4,123,675 A 10/1978 Moskowitz et al.
(Continued)

FOREIGN PATENT DOCUMENTS

DE 29 32 888 A1 2/1981
DE 10 2008 041 310 A1 3/2009
(Continued)

OTHER PUBLICATIONS

German Office Action, with translation thereof, for corresponding DE Appl No. 10 2011 080 318.1, dated Jun. 21, 2012.
(Continued)

*Primary Examiner* — Robert A Siconolfi
*Assistant Examiner* — Mahbubur Rashid
(74) *Attorney, Agent, or Firm* — Fish & Richardson P.C.

(57) ABSTRACT

The invention relates to a damping arrangement for dissipating oscillation energy of an element in a system, more particularly in a microlithographic projection exposure apparatus, comprising an absorber mass, which is mounted via a stable mounting with respect to the element, wherein the absorber mass is arranged in a cavity present within the element and is at least partly surrounded by a fluid situated in the cavity, wherein a mass-spring system is formed by the absorber mass, the system damping a translational movement component of an oscillation of the element that exists at the linking point of the absorber mass, and wherein the
(Continued)

stable mounting is formed by a rheological fluid that is electrically controllable or controllable via electric or magnetic fields.

23 Claims, 9 Drawing Sheets

Related U.S. Application Data

(60) Provisional application No. 61/514,550, filed on Aug. 3, 2011.

(58) Field of Classification Search
USPC .......................................... 188/267, 378, 380
See application file for complete search history.

(56) References Cited

U.S. PATENT DOCUMENTS

| | | | | |
|---|---|---|---|---|
| 4,679,775 A * | 7/1987 | Funaki | ...................... | F16F 6/00 188/267.2 |
| 4,825,983 A * | 5/1989 | Nakanishi | ............ | F16F 15/1485 188/218 A |
| 5,660,397 A * | 8/1997 | Holtkamp | ................ | C09K 3/10 277/410 |
| 5,906,254 A * | 5/1999 | Schmidt | ................ | F16F 7/1005 188/378 |
| 6,009,985 A * | 1/2000 | Ivers | ...................... | F16F 7/1005 188/380 |
| 6,151,930 A * | 11/2000 | Carlson | ................... | D06F 37/20 68/12.06 |
| 6,327,024 B1 * | 12/2001 | Hayashi | .................. | F16F 15/02 188/267 |
| 6,494,106 B1 * | 12/2002 | Cage | ..................... | G01F 1/8418 73/861.357 |
| 7,401,834 B2 * | 7/2008 | Browne | ............... | B60N 2/2887 296/68.1 |
| 7,826,155 B2 * | 11/2010 | Geuppert | .............. | F16F 15/023 359/819 |
| 2004/0057817 A1 | 3/2004 | Hazelton | | |
| 2004/0184631 A1 | 9/2004 | Hosler | | |
| 2008/0053763 A1 | 3/2008 | Wereley et al. | | |
| 2011/0193277 A1 * | 8/2011 | Christenson | .......... | F16F 7/1028 267/140.14 |
| 2011/0316363 A1 * | 12/2011 | Kim | ...................... | F16F 7/1011 310/28 |
| 2012/0138401 A1 | 6/2012 | Vogler et al. | | |

FOREIGN PATENT DOCUMENTS

| | | | |
|---|---|---|---|
| DE | 10 2007 048 183 A1 | 4/2009 | |
| DE | 10 2008 054 459 A1 | 6/2010 | |
| DE | 10 2009 005 954 A1 | 7/2010 | |
| DE | 102012220925 A1 * | 11/2013 | ............. F16F 15/03 |
| JP | S 61-162632 U | 10/1986 | |
| JP | H 08-170990 A | 7/1996 | |
| WO | WO 2006/084657 A1 | 8/2006 | |
| WO | WO 2007/006577 A1 | 1/2007 | |

OTHER PUBLICATIONS

International Preliminary Report on Patentability for corresponding PCT Appl No. PCT/EP2012/064857, dated Feb. 13, 2014.1.
Japanese Office Action, with translation thereof, for corresponding JP Appl No. 2014-523297, dated Jul. 29, 2016.
International Search Report and Written Opinion for corresponding PCT Appl No. PCT/EP2012/064857, dated Nov. 8, 2011.

* cited by examiner

US 9,593,733 B2

DAMPING ARRANGEMENT FOR DISSIPATING OSCILLATING ENERGY OF AN ELEMENT IN A SYSTEM, MORE PARTICULARLY IN A MICROLITHOGRAPHIC PROJECTION EXPOSURE APPARATUS

CROSS REFERENCE TO RELATED APPLICATIONS

The present application is a continuation of, and claims priority under 35 USC 120 to, international application PCT/EP2012/064857, filed Jul. 30, 2012, which claims priority under 35 USC 119 to German Patent Application DE 10 2011 080 318.1 and priority under 35 USC 119e to U.S. 61/514,550, both filed on Aug. 3, 2011. The content of these applications is hereby incorporated by reference.

BACKGROUND OF THE INVENTION

Field of the Invention

The invention relates to a damping arrangement for dissipating oscillating energy of an element in a system, more particularly in a microlithographic projection exposure apparatus.

Prior Art

Microlithography is used for producing microstructured components, such as, for example, integrated circuits or LCDs. The microlithography process is carried out in a so-called projection exposure apparatus comprising an illumination device and a projection lens. The image of a mask (=reticle) illuminated via the illumination device is in this case projected via the projection lens onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation having a wavelength of less than 15 nm), for lack of availability of light-transmissive materials, mirrors are used as optical components for the imaging process.

In the operation of projection exposure apparatuses, more particularly in the case of EUV systems, aspects relating to dynamics are becoming increasingly important for the optical performance of the system. Mechanical disturbances caused by vibrations always have a disadvantageous effect on the positional stability of the optical components. Weakly damped mechanical resonances in the system lead, in the range of resonant frequencies, to a local excessive increase in the disturbance spectrum and to an associated impairment of the positional stability of passively mounted components and also of actively controlled components. Furthermore, resonances in the case of controlled systems can lead to instability of the control loop.

Possible measures for eliminating the control instability caused by mechanical resonances, such as, for instance, reducing the control bandwidth or introducing local suppression filters (so-called "notch filter"), depending on the situation, have a disadvantageous to dramatic effect on the control performance and on the associated positional stability of the controlled optical element. In the worst case, the system can no longer be controlled stably at all. An additional aggravating factor is that the natural frequency spectra of the mechanical structures, for the dimensions of the mirrors and also of the carrying and measurement structures, the dimensions increasing as numerical apertures increase, are shifting toward lower frequencies to an ever greater extent. Consequently, oscillations that occur lead to growing problems with regard to the performance of the system and also to the effect that active position control as described initially can no longer be operated stably.

Since the (e.g. metallic or ceramic) materials permitted in EUV systems with regard to the required vacuum resistance themselves have only little intrinsic damping, further damping measures are required in order to overcome or alleviate the problems mentioned above. Various damping concepts are known in the prior art. In this respect, reference is made, for example, to WO 2006/084657 A1, WO 2007/006577 A1, DE 10 2008 041 310 A1, DE 10 2009 005 954 A1 and U.S. Pat. No. 4,123,675.

FIGS. 8a-b schematically illustrate typical conventional approaches.

In accordance with FIG. 8a, a mass-spring system comprising a mass 10 elastically suspended relative to a structure 5 via a spring 11 is damped via a damping element 12 connected in parallel with the spring 11 between mass 10 and structure 5. With regard to the required vacuum resistance, however, the choice of suitable materials for the damping element with sufficient intrinsic damping is limited in an EUV projection exposure apparatus. Further problems can result from the fact that the stiffness properties and also the damping properties of the materials can change over time.

In accordance with FIG. 8b, damping is effected via an absorber mass 15 elastically linked to the mass 10 via a further spring 13 and a damping element 14 connected in parallel therewith wherein the resonant frequencies of the respective mass-spring systems composed of absorber mass 15 and spring 13, on the one hand, and composed of mass 10 and spring 11, on the other hand, are tuned to one another in order to achieve an effective damping.

Even though the damping via an absorber mass is advantageous particularly in situations in which e.g. mechanical linking to a reference system as in FIG. 8a via dampers is not possible, with available materials such as fluoroelastomers, for example, the problem can still occur that these have, in addition to the desired damping effect, an undesirably high parasitic intrinsic stiffness which, moreover, can vary temporally over the lifetime of the system or else when there are changes in the atmosphere, and so as a result, besides the desirable damping effect, changes in the resonant frequency of the damping arrangement can also arise with the consequence that the abovementioned required tuning to the resonant frequency of the element to be damped or of the associated mass-spring system is no longer provided.

SUMMARY OF THE INVENTION

It is an object of the present invention to provide a damping arrangement for dissipating oscillation energy of an element in a system, more particularly in a microlithographic projection exposure apparatus, which enables effective and temporally stable damping.

This object is achieved via a damping arrangement as described in the following paragraph.

A damping arrangement for dissipating oscillation energy of an element in a system, more particularly in a microlithographic projection exposure apparatus, comprises:
- an absorber mass, which is mounted via a stable mounting with respect to the element;
- wherein the absorber mass is arranged in a cavity present within the element and is at least partly surrounded by a fluid situated in the cavity;

wherein a mass-spring system is formed by the absorber mass, the system damping a translational movement component of an oscillation of the element that exists at the linking point of the absorber mass; and wherein the stable mounting is formed by a rheological fluid that is electrically controllable or controllable via electric or magnetic fields.

The linking point can be, depending on the oscillation mode to be damped, either the center of gravity of the element or a position outside the center of gravity (e.g. in an oscillation antinode of a flexible oscillation mode), such that the linking point can be chosen suitably depending on the oscillation mode to be damped. Consequently, the invention also encompasses situations in which the element performs overall e.g. a rotational oscillation, a pendulum oscillation or a deformation oscillation mode. The damping according to the invention can therefore be used for the damping of translational or rotational rigid-body modes and for the damping of deformation oscillation modes.

The invention is based on the concept, in particular, of realizing in a system, more particularly in a microlithographic projection exposure apparatus, the damping of the translational movement of an element (which can be e.g. a structural element or a drive element) by virtue of the fact that an absorber mass mounted relative to the element in a cavity via a stable mounting experiences a viscous damping by a fluid which at least partly surrounds the absorber mass. According to the above aspect of the disclosure, the stable mounting is formed by a rheological fluid, the rheological fluid being electrically controllable or being controllable via electric or magnetic fields.

If, in the case of an oscillation occurring at the element, the absorber mass is displaced relative to the element, the fluid situated in the cavity flows around the absorber mass, which results in a viscous damping (i.e. damping proportional to the relative velocity of absorber mass and element). Since the absolute value of the damping constant is dependent both on the viscosity of the fluid and on the concrete dimensioning of the arrangement composed of absorber mass and cavity surrounding the latter (gap dimensions, etc.), through a suitable choice of these parameters the natural frequencies of the oscillation absorber constructed according to the invention and of the mechanical linking of the relevant oscillating element to be damped can be optimally adapted to one another.

At the same time, the introduction of additional significant stiffnesses can be avoided in this case, such that it is also possible to take account of the requirements in respect of ever lower natural frequencies in the system and also of sufficient temporal stability of the damping effect achieved.

According to a further aspect, the disclosure also relates to a damping arrangement for dissipating oscillation energy of an element in a system, more particularly in a microlithographic projection exposure apparatus, comprising an absorber mass, which is mounted via a stable mounting with respect to the element, wherein the absorber mass is arranged in a cavity present within the element and is at least partly surrounded by a fluid situated in the cavity, and wherein a mass-spring system is formed by the absorber mass, the system damping a translational movement component of an oscillation of the element that exists at the linking point of the absorber mass.

Even though the invention can be realized more particularly in a microlithographic projection exposure apparatus, the invention is not restricted thereto. Rather, the damping arrangement according to the invention can also be used in other (optical or non-optical) systems, more particularly precision systems.

In accordance with one embodiment, a resonant frequency of the mass-spring system formed by the absorber mass differs from at least one resonant frequency to be damped of the element by a maximum of one frequency decade, preferably by a maximum of half a frequency decade.

The stable mounting of the absorber mass can be realized, in principle, with an elastic suspension in the form of an arbitrary suitable spring system.

In accordance with one preferred configuration of the invention, the stable mounting is realized by a ferrofluid being chosen as the fluid situated in the cavity.

As is known, a ferrofluid is a liquid which reacts to a magnetic field and is formed by magnetic particles (typically having dimensions of a few nanometers), being suspended in a carrier liquid. In a magnetic field, such a ferrofluid arranges itself in an energetically optimum manner (i.e. in regions of maximum field strength), wherein the ferrofluid, e.g. at the pole ends of a cylindrical bar magnet, substantially forms an ellipsoid having an energetically optimum minimum surface area.

The invention is based on the further insight, then, that in the above-described arrangement of an absorber mass in a cavity present within the element, a stable bearing for the absorber mass can be formed by the ferrofluid, specifically by using the self-centering properties of the ferrofluid with respect to the absorber mass.

In other words, when the fluid used according to the invention is realized in the form of a ferrofluid, this ferrofluid performs a double function insofar as it firstly provides for the elastic suspension or stable mounting of the absorber mass owing to the stiffness provided by the ferrofluid in a magnetic field, but secondly also brings about the viscous damping when flowing along the absorber mass.

The required tuning of the resonant frequency of the oscillation absorber formed according to the invention by the absorber mass mounted in the ferrofluid to the resonant frequency to be damped can in this case be effected elegantly through a suitable choice of the magnetic field strength and suitable definition of the geometrical dimensions in the cavity (in particular gap thickness between the absorber mass and the wall of the cavity), since the bearing stiffness is dependent on the magnetic field strength and the gap dimensions of the gap that remains in the cavity toward the absorber mass and receives the ferrofluid.

In accordance with one embodiment, the damping arrangement comprises at least one magnet. In this case, the absorber mass can be formed by the magnet by virtue of the magnet being suspended movably within the cavity.

In further embodiments, however, the magnet can also be fixedly linked to the relevant element, wherein the absorber mass is produced from a nonmagnetic material. Such a configuration has the advantage, in particular, that an arrangement of a plurality of oscillation absorbers constructed in the above-described manner according to the invention alongside one another can be realized without an undesirable relative movement of the magnets that are adjacent in such an arrangement taking place. Furthermore, owing to the fixing of the magnets, there is the possibility of providing magnet termination elements (e.g. in the form of iron plates or the like) for suppressing magnetic leakage fields in conjunction with the damping arrangement according to the invention, without an undesirable relative movement between such magnet termination elements and the magnets through to a mechanical short circuit taking place.

In accordance with one embodiment, the elastic suspension or stable mounting of the absorber mass has a resonant frequency corresponding to a resonant frequency to be damped of the element, in order to achieve an efficient damping.

In this respect, some mathematical relationships are explained below with reference to FIG. 7a and FIG. 7b. FIG.

7a shows a schematic diagram for elucidating the concept of the damping of a first mass-spring system by a second mass-spring system, which is tuned to the first mass-spring system with regard to its resonant frequency, wherein the definitions of the variables used in FIG. 7a and in the further mathematical formulae are evident from Table 1.

TABLE 1

| | |
|---|---|
| s | Laplace variable |
| $m_1$ | First mass (=mass to be damped) |
| $m_2$ | Auxiliary mass (=absorber mass) |
| $q_1$ | Deflection of the mass to be damped |
| $q_2$ | Deflection of the auxiliary mass |
| $k_1$ | Spring stiffness between first mass and base (or further mass) |
| $k_2$ | Spring stiffness between first mass and auxiliary mass |
| $c_1$ | Viscous damping element between first mass and base |
| $c_2$ | Viscous damping element between first mass and auxiliary mass |
| $F_E$ | Disturbance or excitation force on first mass |
| $F_B$ | Force on base (via $k_1$ and $c_1$) |

For the deflection $q_1$ of the mass $m_1$ to be damped, the following relationship follows from the fundamental equations of motion of the masses $m_1$ and $m_2$:

$$q_1(s) = \underbrace{\frac{m_2 s^2 + c_2 s + k_2}{(m_1 s^2 + (c_1 + c_2)s + (k_1 + k_2))(m_2 s^2 + c_2 s + k_2) - (c_2 s + k_2)^2}}_{H(s)} F_E(s) \quad (1)$$

The following holds true for the associated transfer function of $F_E$ (=disturbance or excitation force) with respect to $F_B$ (=force on base):

$$F_B(s) = (k_1 + s c_1) H(s) F_E(s) \quad (2)$$

FIG. 7b illustrates, for the system from FIG. 7a, the transfer function of $F_E$ (=disturbance or excitation force) with respect to $F_B$ (=force on base) in units of dB for different combinations of the parameters $f_2$ and $\zeta_2$ (=degree of damping of the mass-spring system) against the frequency axis, which is normalized to the resonant frequency $f_1$ of the first mass-spring system ($m_1$, $k_1$) and on a logarithmic scale, wherein the parameterization evident from Table 2 was performed. In the diagrams in FIG. 7b, firstly, the resonant frequency $f_2$ of the mass-spring system ($m_2$, $k_2$) is in each case "tuned" relative to the resonant frequency $f_1$ of the mass-spring system ($m_1$, $k_1$) and, secondly, the degree of damping of the mass-spring system ($m_2$, $k_2$) of the auxiliary mass $m_2$ is also varied, wherein a very weak damping of the first mass-spring system ($\zeta_1 = 10^{-3}$) is taken as a basis. In this case, in the diagrams in FIG. 7b, the respectively indicated resonant frequency $f_2$ of the mass-spring system ($m_2$, $k_2$) is normalized to the resonant frequency $f_1$ of the mass-spring system ($m_1$, $k_1$).

TABLE 2

| | |
|---|---|
| $m_1 = 1$ | Normalized mass |
| $m_2 = \dfrac{m_1}{10}$ | Auxiliary mass |
| $\omega_{o,1} = 1$ | Natural frequency of the mass-spring system ($m_1$, $k_1$) |
| $\omega_{o,2}$ = variable | Natural frequency of the mass-spring system ($m_2$, $k_2$) |
| $k_1 = \omega_{o,1}^2 m_1$ | Spring stiffness between first mass and base (or further mass) |
| $k_2 = \omega_{o,2}^2 m_2$ | Spring stiffness between first mass and auxiliary mass |
| $\zeta_1 = 10^{-3}$ | Degree of damping of the mass-spring damping system ($m_1$, $k_1$, $c_1$) |
| $\zeta_2$ = variable | Degree of damping of the mass-spring damping system ($m_2$, $k_2$, $c_2$) |

TABLE 2-continued

| | |
|---|---|
| $c_1 = \dfrac{2\zeta_1 k_1}{\omega_{o,1}}$ | Viscous damping element between first mass and base |
| $c_2 = \dfrac{2\zeta_2 k_2}{\omega_{o,2}}$ | Viscous damping element between first mass and auxiliary mass |

The degree of damping of the mass-spring system ($m_2$, $k_2$) formed by the auxiliary mass $m_2$ increases from the upper to the lower row of diagrams from FIG. 7b, namely from a low value $\zeta_2 = 0.01$ for the diagrams of the upper row to a value $\zeta_2 = 10$ for the diagrams of the lower row in FIG. 7b. As can likewise be discerned, an increase in the damping of the mass-spring system ($m_2$, $k_2$) formed by the auxiliary mass $m_2$ leads to a decrease in the two "side peaks" present initially (i.e. in the case of low damping) in the vicinity of the resonant frequency of the mass-spring system ($m_1$, $k_1$), but a further increase in the damping leads again to a more highly pronounced peak or a more pronounced sharpness of resonance. A—relative to the optimum value—lower value (upper row in FIG. 7b, $\zeta_2 = 0.01$) or higher value (lower row in FIG. 7b, $\zeta_2 = 10$) of the degree of damping $\zeta_2$ of the mass-spring system ($m_2$, $k_2$) formed by the auxiliary mass $m_2$ leads to a lower damping efficiency. The last-mentioned effect can be explained by the fact that, in the case of an excessively high degree of damping of the mass-spring system ($m_2$, $k_2$) formed by the auxiliary mass $m_2$, the energy dissipation is suppressed since practically no movement bringing about the energy dissipation takes place any longer.

As is furthermore evident from a comparison of the diagrams from FIG. 7, with suitable choice of the damping it is possible to obtain high robustness with regard to a frequency detuning of the auxiliary or absorber mass (that is to say an effective damping even over a wide frequency spectrum). In particular, the middle row in FIG. 7b shows that a well-damped system for all frequency values $f_2$ examined is obtained by increasing the degree of damping $\zeta_2$ to a value of approximately $\zeta_2 \approx 0.3$.

With regard to the tuning of the mass-spring system ($m_2$, $k_2$) formed by the auxiliary mass $m_2$, an optimum suppression results at $f_2 = 1$ that is to say if the resonant frequency of the mass-spring system formed by the auxiliary mass $m_2$ corresponds to the resonant frequency $f_1$ of the mass-spring system ($m_1$, $k_1$) to be damped.

It is apparent as a conclusion that, besides a tuning of the resonant frequency of the mass-spring system formed by the auxiliary mass, an optimization of the degree of damping of the system is also afforded.

In accordance with one embodiment, the stable mounting or the elastic suspension of the absorber mass is configured in such a way that this has at least two separate bearings for the elastic suspension of the element in two different degrees of freedom. In particular, the bearings may comprise at least one bearing acting in an axial direction relative to an element axis of the element and at least one bearing acting in a radial direction relative to the element axis. In this case, preferably, the mass-spring system formed by the absorber mass has different resonant frequencies and/or different degrees of damping for the at least two degrees of freedom.

The invention furthermore relates to a projection exposure apparatus comprising a damping arrangement according to the invention. The projection exposure apparatus can be designed more particularly for operation in the EUV. In further applications, the projection exposure apparatus can also be designed for operation in the VUV range, for example for wavelengths of less than 200 nm, more particular less than 160 nm.

Further configurations of the invention can be gathered from the description and the dependent claims. The invention is explained in greater detail below on the basis of exemplary embodiments illustrated in the accompanying drawings.

DETAILED DESCRIPTION OF PREFERRED EMBODIMENTS

Firstly, a damping arrangement in accordance with a first embodiment of the disclosure is explained below with reference to FIG. 1. The damping arrangement according to the disclosure is illustrated in the right-hand part of FIG. 1, whereas that is contrasted with a conventional damping arrangement using an oscillation absorber in the left-hand part of FIG. 1 for comparison purposes.

Figure 1:
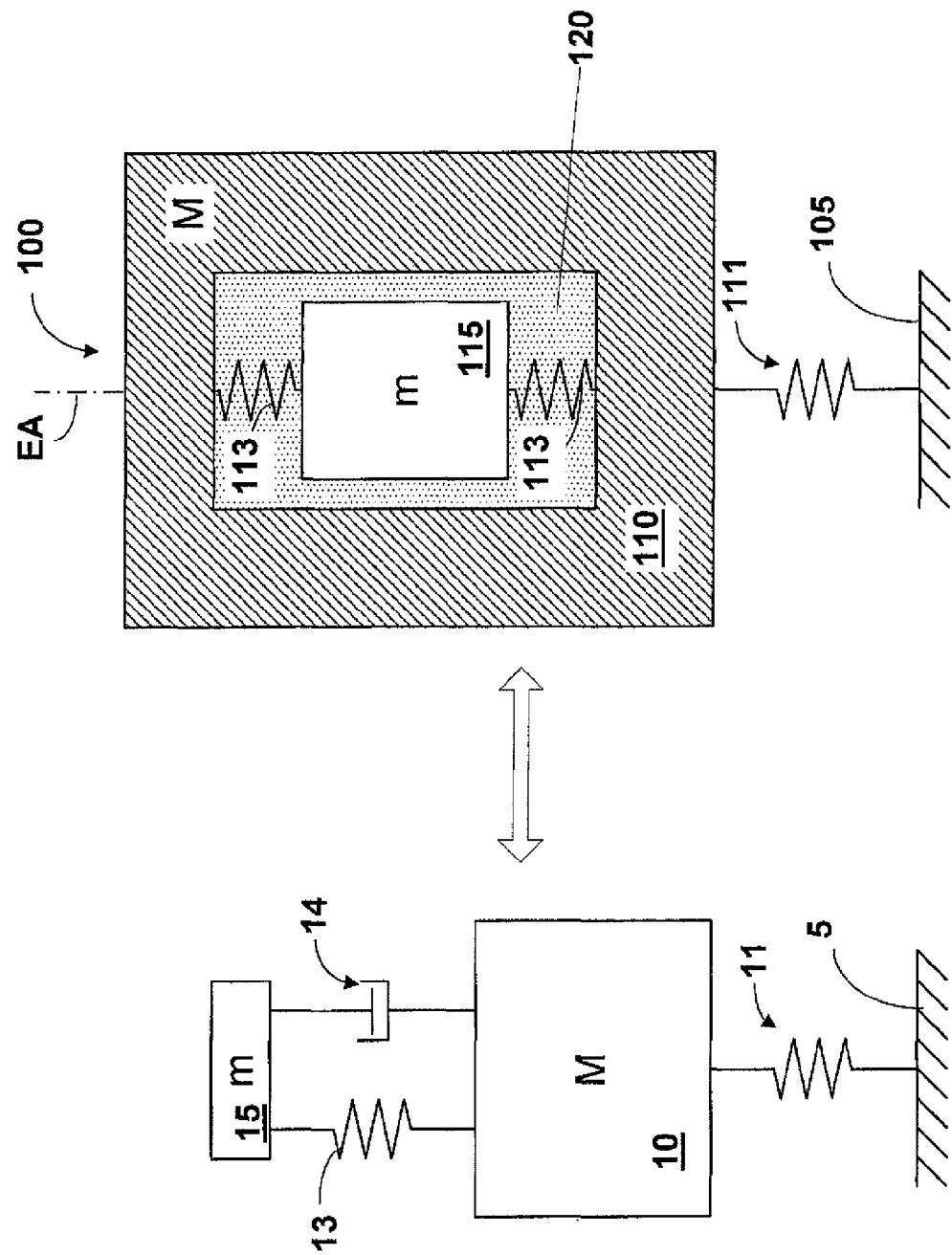
FIG. 1 shows a schematic illustration for elucidating the construction of a damping arrangement according to the disclosure in accordance with a first embodiment.

The damping arrangement 100 according to FIG. 1 serves for dissipating oscillation energy of an element 110 in a system, more particularly in a microlithographic projection exposure apparatus. The element 110 can be, for example, an optical element (more particularly a mirror), an actuator component of an actuator serving for actuating such an optical element, an articulated element, a reaction or filter mass or an arbitrary structural element, for example a carrying frame or a measurement frame.

In the exemplary embodiment (and without the invention being restricted thereto) the element 110 is a mirror which, relative to a carrying structure 105, forms an oscillating mass-spring system having a predefined resonant frequency, wherein the spring of the mass-spring system is designated by "111" in FIG. 1.

In accordance with FIG. 1, the element 110 has in its interior a sealed cavity, in which an absorber mass 115 is mounted via an elastic suspension, wherein the elastic suspension is realized via a spring system 113 in this example. Furthermore, a fluid 120 (e.g. an oil) is situated in the sealed cavity, the fluid surrounding the absorber mass 115 at least partly (completely in the example in FIG. 1).

In the damping arrangement 100 in FIG. 1, an oscillation that occurs at the element 110 has the consequence that the absorber mass 115 performs a relative movement with respect to the element 110, as a result of which the fluid 120 flowing in the cavity along the absorber mass 115 in the gap region remaining with respect to the wall of the cavity brings about a viscous damping (i.e. damping proportional to the relative velocity of absorber mass 115 and element 110).

In this case, the damping constant can be optimally coordinated with the respective requirements via the geometry of the absorber mass 115 and of the surrounding gap in all degrees of freedom of movement. Depending on the intended use, typical masses of the auxiliary or absorber mass can be in the range of a few grams (g), such as in the case of the damping of spring elements and pins, for instance, through to several kilograms (kg), such as in the case of the damping of comparatively large carrying structures.

Furthermore, the stiffness of the spring system 113 can be chosen in such a way that the resonant frequency of the oscillation absorber formed by this damping arrangement corresponds to the resonant frequency to be damped of the mass-spring system composed of element 110 and spring 111.

Furthermore, the stiffness of the spring system 113 and the damping constant of the viscous damping caused by the fluid can be chosen in such a way that the resonant frequency and degree of damping of the oscillation absorber formed by this damping arrangement for a frequency spectrum to be damped of the mass-spring system composed of element 110 and spring 111 produce an optimum damping effect.

Furthermore, the stiffness of the spring system 113 and the damping constant of the viscous damping caused by the fluid can be chosen in a direction-dependent manner, as a result of which the oscillation absorber can be optimally tuned to the oscillation modes to be damped of the mass-spring system, which generally differ in frequency and deflection direction at the position of the oscillation absorber.

Further embodiments of the disclosure are explained below with reference to the schematic illustrations in FIGS. 2-7. These embodiments differ from the exemplary embodiment from FIG. 1 in particular in that the fluid chosen is a ferrofluid comprising, in a manner known per se, magnetic particles suspended in a carrier liquid, the ferrofluid reacting to a magnetic field by assuming an energetically optimum surface area in each case.

The embodiments that now follow in accordance with FIGS. 2-7 are in each case based on the insight that in the cavity within the relevant element whose oscillation energy is intended to be dissipated via the damping arrangement according to the invention, a stable mounting of the respective absorber mass is already made possible owing to the stiffness provided by the ferrofluid when a magnetic field is present, without this necessitating an additional "conventional" spring system.

Although the embodiments being described in the following with reference to FIG. 2ff are making use of a ferrofluid, the invention is not limited thereto. In general, the fluid chosen (also in order to realize the stable mounting) can be formed by a rheological fluid (which can be an electro-rheological fluid or a magneto-rheological fluid) that is electrically controllable or controllable via electric or magnetic fields.

Figure 2:
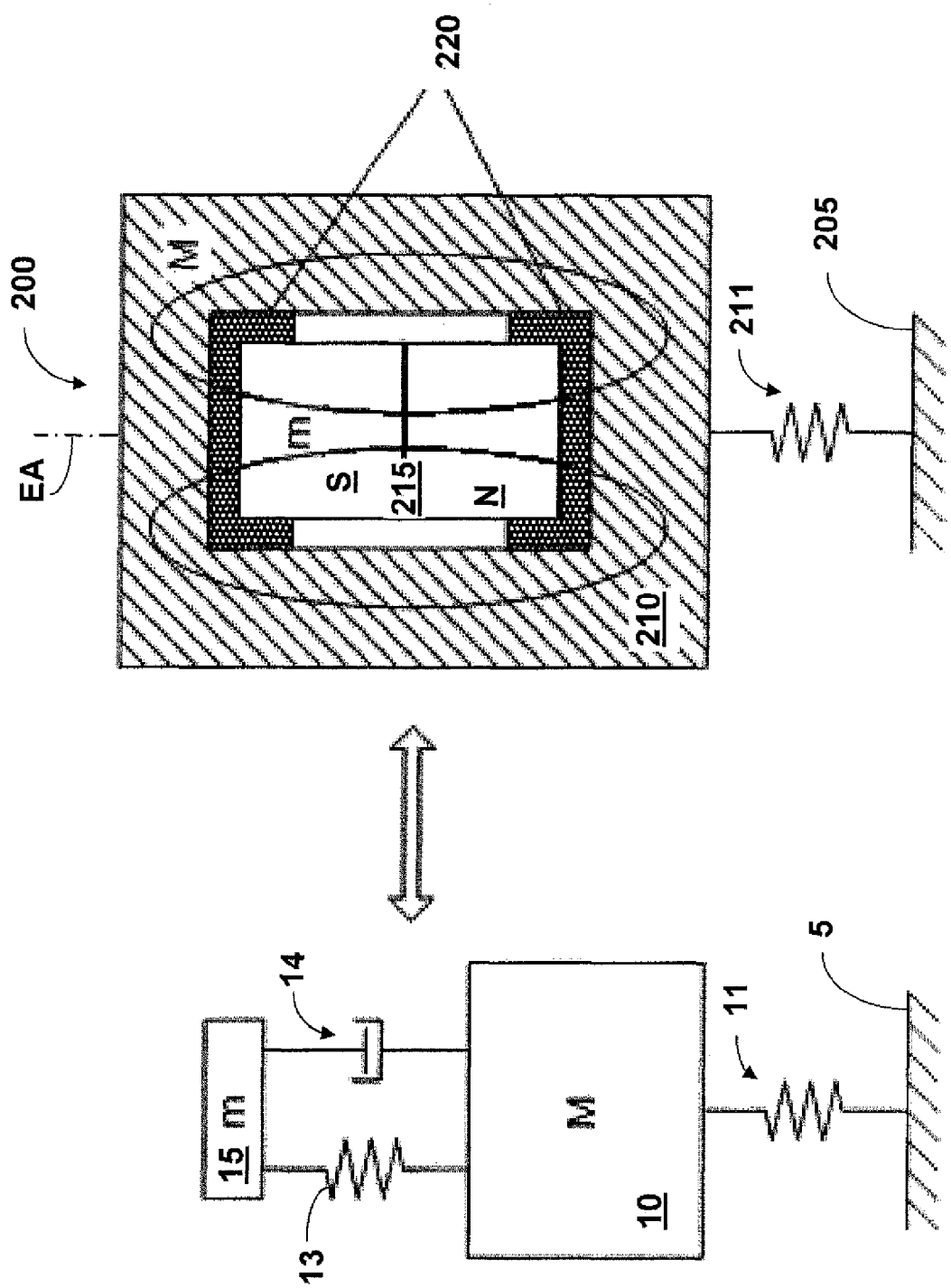
FIG. 2 shows a schematic illustration for elucidating the construction of a damping arrangement according to the invention in accordance with a second embodiment.

Specifically, in the exemplary embodiment in FIG. 2, a permanent magnet (having South pole "S" and North pole "N") is arranged within the cavity formed in the element 210 and in the exemplary embodiment itself forms the absorber mass 215 mounted stably via the ferrofluid 220 relative to the element 210 or that wall thereof which surrounds the cavity. As can be seen from the simplified illustration in FIG. 2, this mounting is based on the fact that the ferrofluid 220 arranges itself in each case "energetically optimally" at the pole ends of the magnet forming the absorber mass 215, since the regions of maximum field strength are in each case present there. Without constraining the ferrofluid 220 into the gap region remaining between absorber mass 215 and element 210, the geometry of the ferrofluid 220 in the region of the pole ends would in each case resemble that of an ellipse. In the damping arrangement 200 in FIG. 2, by contrast, the ferrofluid 220 constrained in the cavity between absorber mass 215 and element 210 forms a stable self-centering bearing for the absorber mass 215, wherein the self-centering effect is imparted both via the axial gaps relative to the element axis EA of the element 210 and via the radial gaps relative to the element axis EA.

The stiffness of the bearing for the absorber mass 215, the bearing being formed by the ferrofluid 220 in the damping arrangement 200 in accordance with FIG. 2, is dependent on the magnetic field strength present, on the ferrofluid chosen, and also on the gap dimensions in that region of the cavity which receives the ferrofluid 220, and, by suitable setting of these parameters, can be optimally tuned to the resonant frequency to be damped (i.e. the resonant frequency of the mass-spring system composed of element 210 and spring 211).

Even though, in the exemplary embodiment described above with reference to FIG. 2, the magnet required for generating the magnetic field that acts on the ferrofluid is formed by the absorber mass 215 itself, the invention is not restricted thereto. Rather, in further embodiments, the absorber mass itself can also be produced from nonmagnetic material, wherein the magnetic field required is in each case generated by at least one additional magnet.

Figure 3:
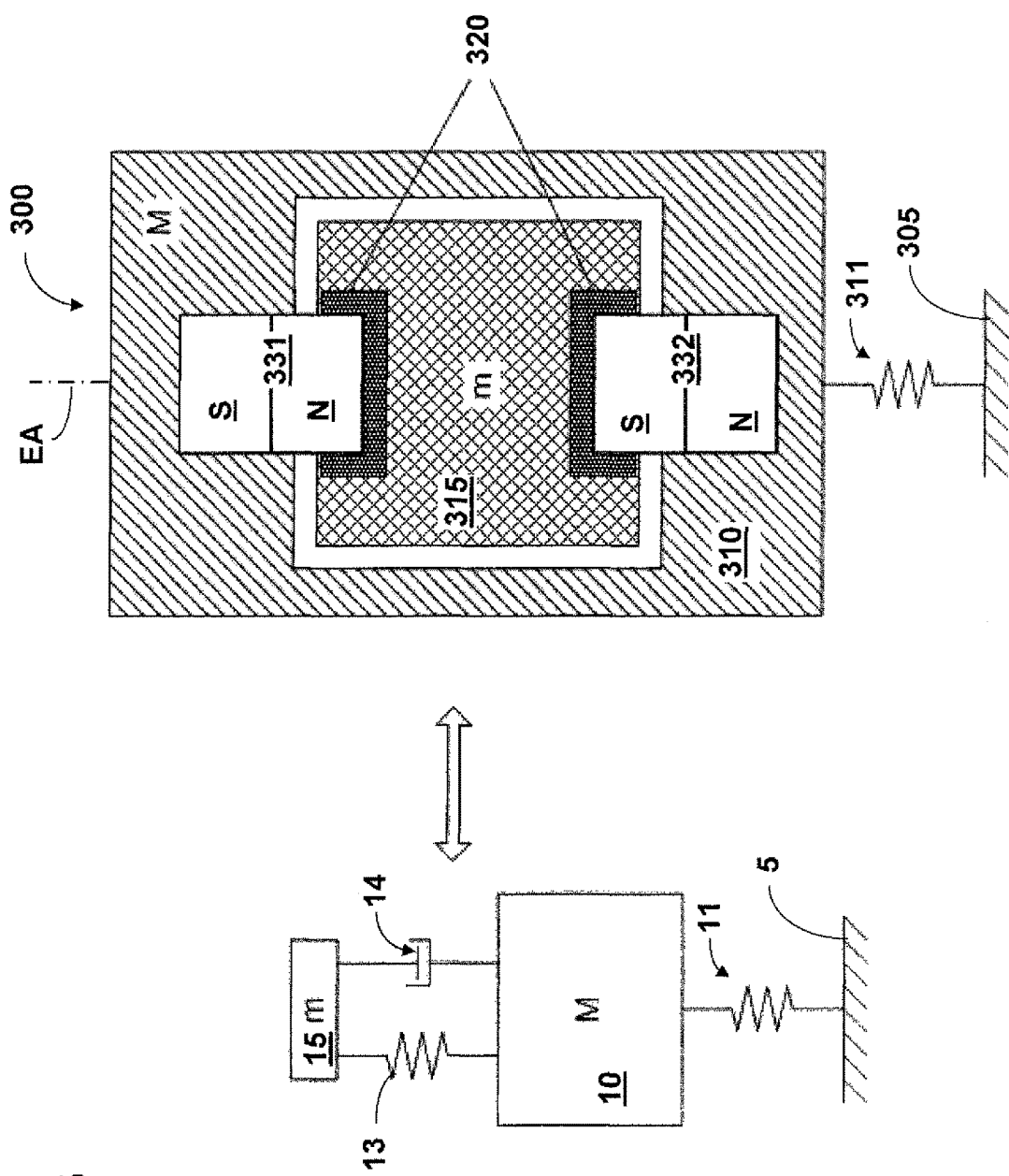
FIGS. 3-6 show schematic illustrations of further embodiments of the invention.

Such an exemplary embodiment is illustrated in FIG. 3, wherein components which are analogous or substantially functionally identical to FIG. 1 are designated by reference numerals increased by "200".

The exemplary embodiment in accordance with FIG. 3 differs from that from FIG. 2 in that the damping arrangement 300 in accordance with FIG. 3 comprises, in addition to the absorber mass 315 (produced from nonmagnetic material), two permanent magnets 331, 332, which are arranged at end sections of the cavity that are opposite each other in an axial direction relative to the element axis EA, the permanent magnets being fixedly attached to the element 310. In this exemplary embodiment, the ferrofluid 320 is constrained within the gap regions remaining between absorber mass 315 and permanent magnets 331 and 332, respectively, and thus forms—in this respect in a manner analogous to the embodiment from FIG. 2—a stable, self-centering bearing for the absorber mass 315. The stationary arrangement of the magnets 331, 332 relative to the optical element in accordance with FIG. 3 in this case advantageously makes it possible to position a plurality of such arrangements alongside one another and also to position suitable magnetic field termination elements (composed of iron plates or the like), without an undesirable movement of the relevant magnets through to a magnetic short-circuit effect being able to occur.

Figure 4:
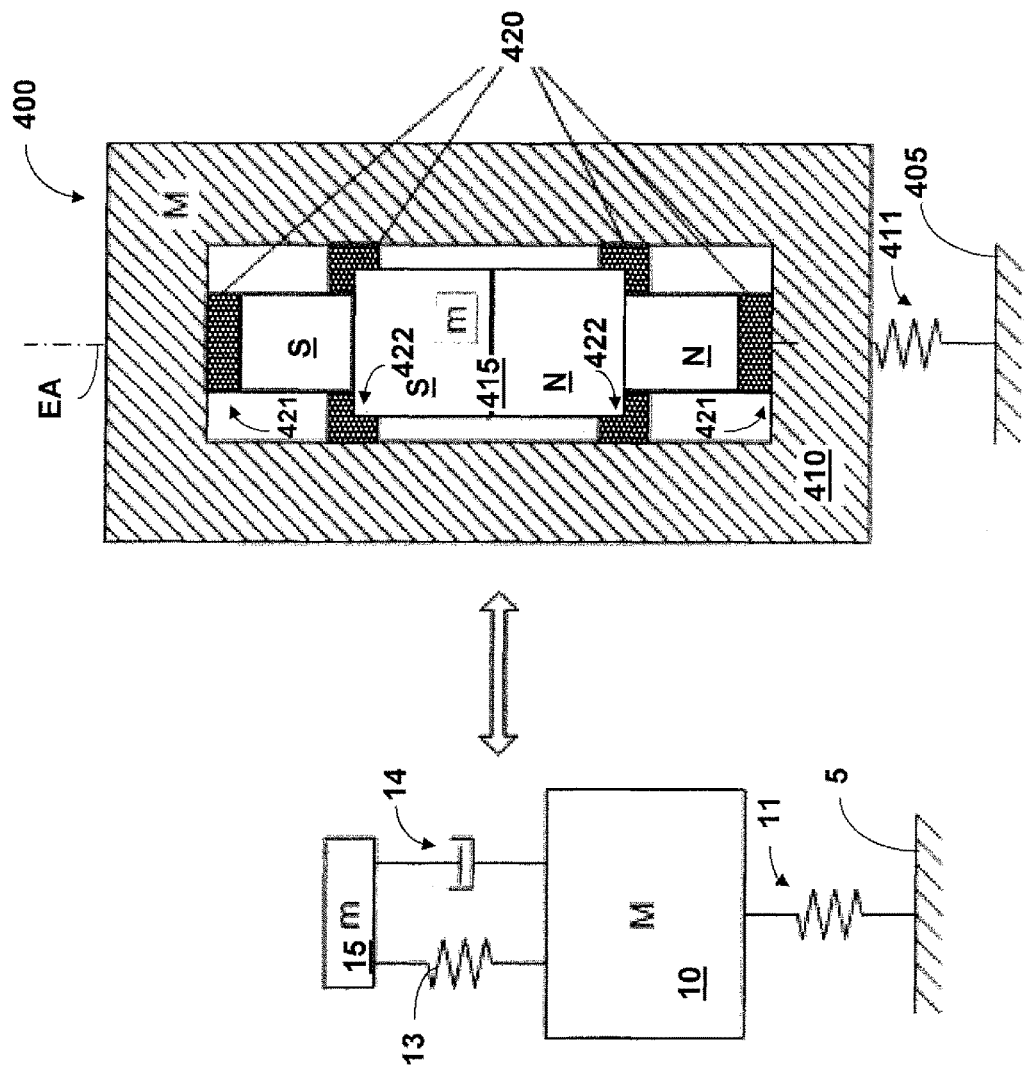

FIG. 4 shows a damping arrangement 400 in accordance with a further embodiment of the invention, wherein analogous or substantially functionally identical components in comparison with FIG. 1 are in turn designated by reference numerals increased by "300".

The damping arrangement 400 in accordance with FIG. 4 differs from the damping arrangement 200 from FIG. 2 substantially in that the magnet which serves for generating the magnetic field acting on the ferrofluid 420 (and likewise forms the absorber mass 415 analogously to FIG. 2), is embodied with sections tapering in an axial direction relative to the element axis EA in such a way that the ferrofluid 420, as can be seen from the schematic illustration in FIG. 4, forms bearing sections separated from one another.

Without being constrained into the cavity situated in the element 410, the ferrofluid 420 in the region of the axial end sections of the magnet forming the absorber mass 415 would substantially assume in each case the geometry of an ellipsoid, whereas the ferrofluid 420 in the region of the transition to the tapering section of the magnet would substantially assume the geometry of an O-ring. Owing to the ferrofluid 420 being constrained in the cavity or in the gap region remaining between the absorber mass 415 and that wall of the element 410 which adjoins the cavity, by contrast, the geometry illustrated in a simplified manner in FIG. 4 is formed, in which the ferrofluid 420 forms a bearing 421 acting in an axial direction relative to the element axis EA and a bearing 422 separate therefrom and acting in a radial direction.

This arrangement advantageously makes it possible to design the stiffnesses respectively present in an axial and a radial direction independently of one another according to the respective requirements, specifically by suitably choosing the gap dimensionings for the bearings 421, 422 by corresponding design of the absorber mass 415.

Figure 5:
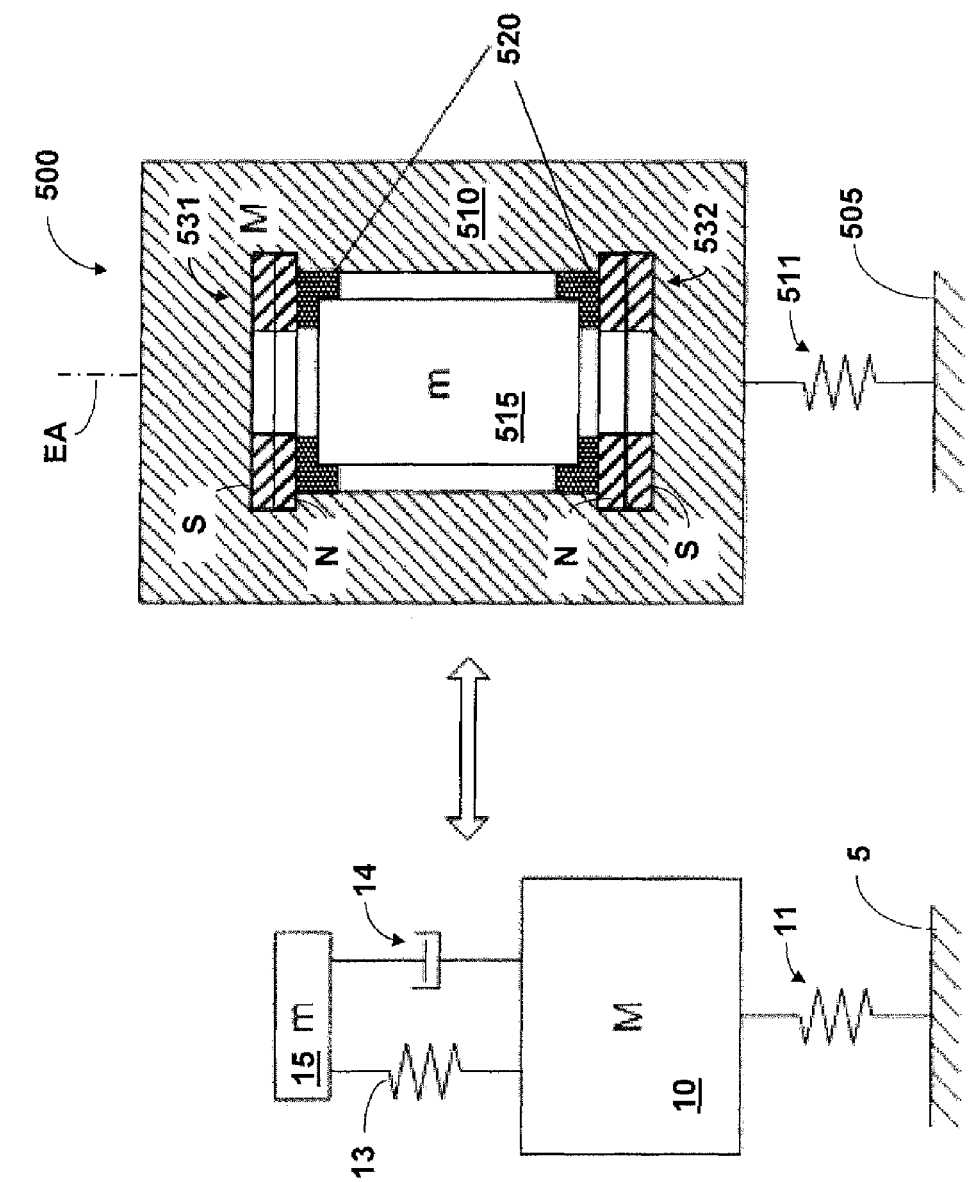

FIG. 5 shows a schematic illustration of a damping arrangement 500 in accordance with a further embodiment of the invention. In this case, analogous or substantially functionally identical components in comparison with the embodiment from FIG. 1 are in turn designated by reference numerals increased by "400".

Analogously to the damping arrangement 300 from FIG. 3, the damping arrangement 500 comprises an absorber mass 515 produced from nonmagnetic material, and two separate magnets 531, 532 for generating the magnetic field that acts on the ferrofluid 520. In contrast to the damping arrangement 300 from FIG. 3, however, in the case of the damping arrangement 500 in accordance with FIG. 5, the magnets 531, 532 are embodied as ring magnets. As can be seen from FIG. 5, the ferrofluid 520 once again arranges itself in the region of the pole ends of the ring magnets 531, 532, the ferrofluid now being constrained within the cavity by wall sections of absorber mass 515, element 510 and ring magnet 531 and 532, respectively.

Figure 6:
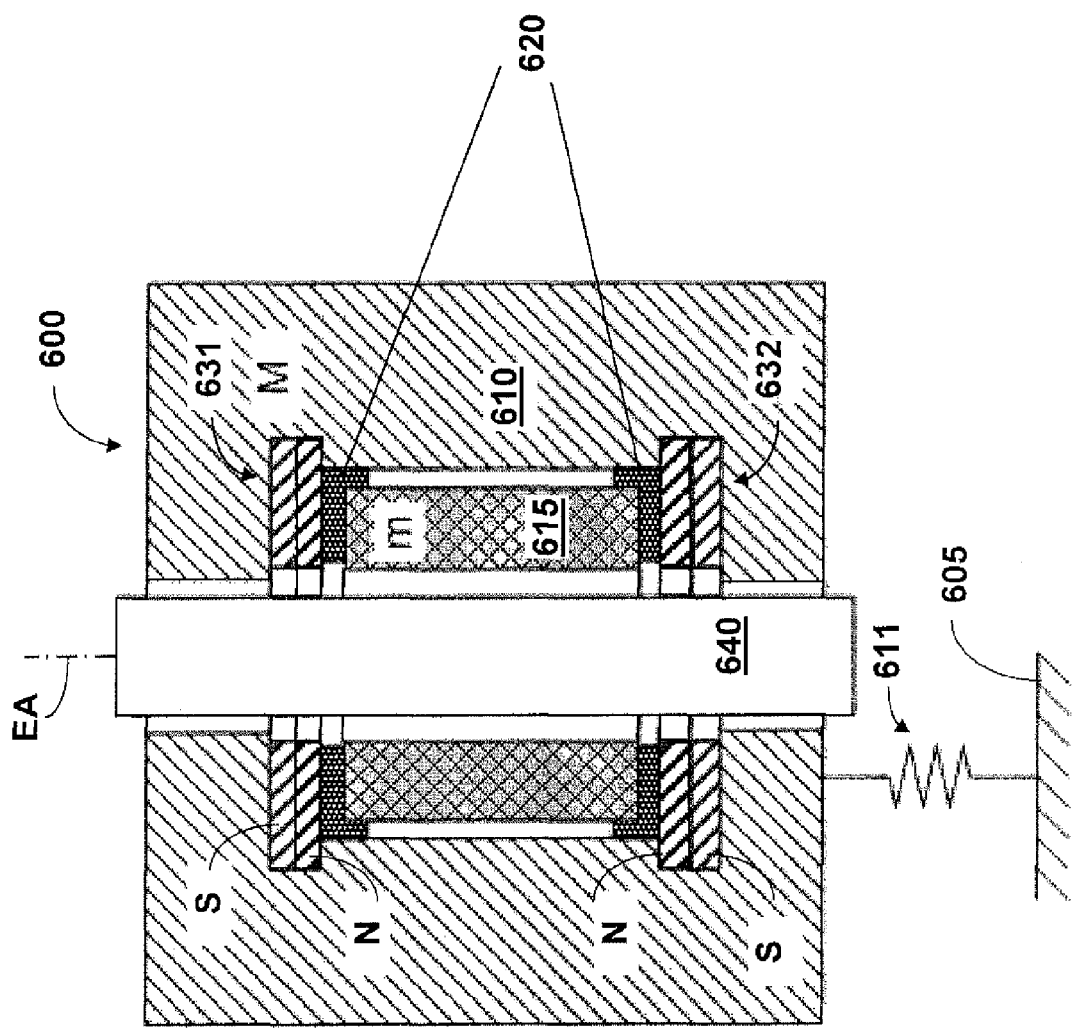
Figure 7A:
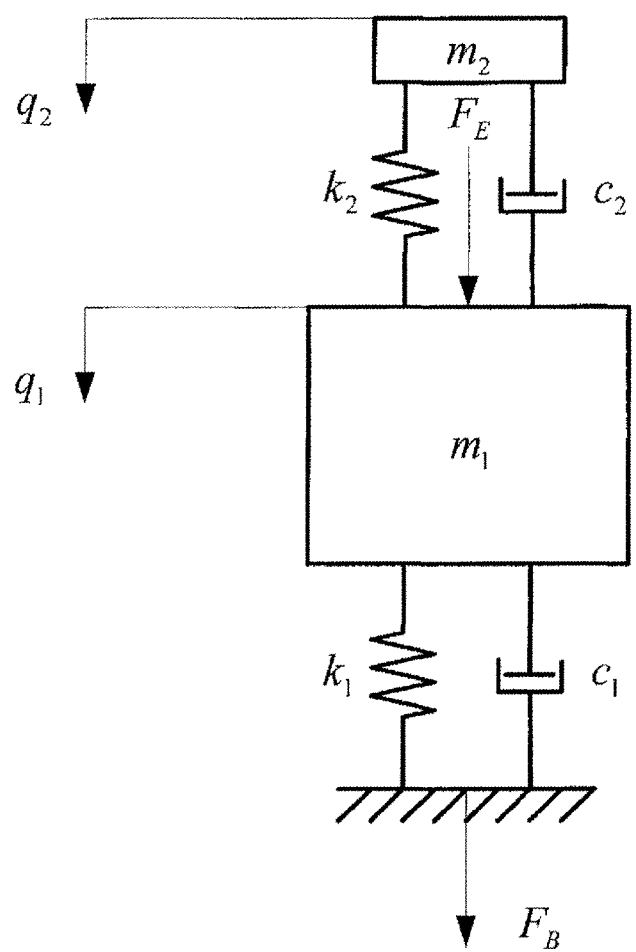
FIGS. 7a-b show a schematic illustration (FIG. 7a) and diagrams (FIG. 7b) for elucidating the concept of the damping of a first mass-spring system by a second mass-spring system, which is tuned to the first mass-spring system with regard to its resonant frequency.
Figure 7B:
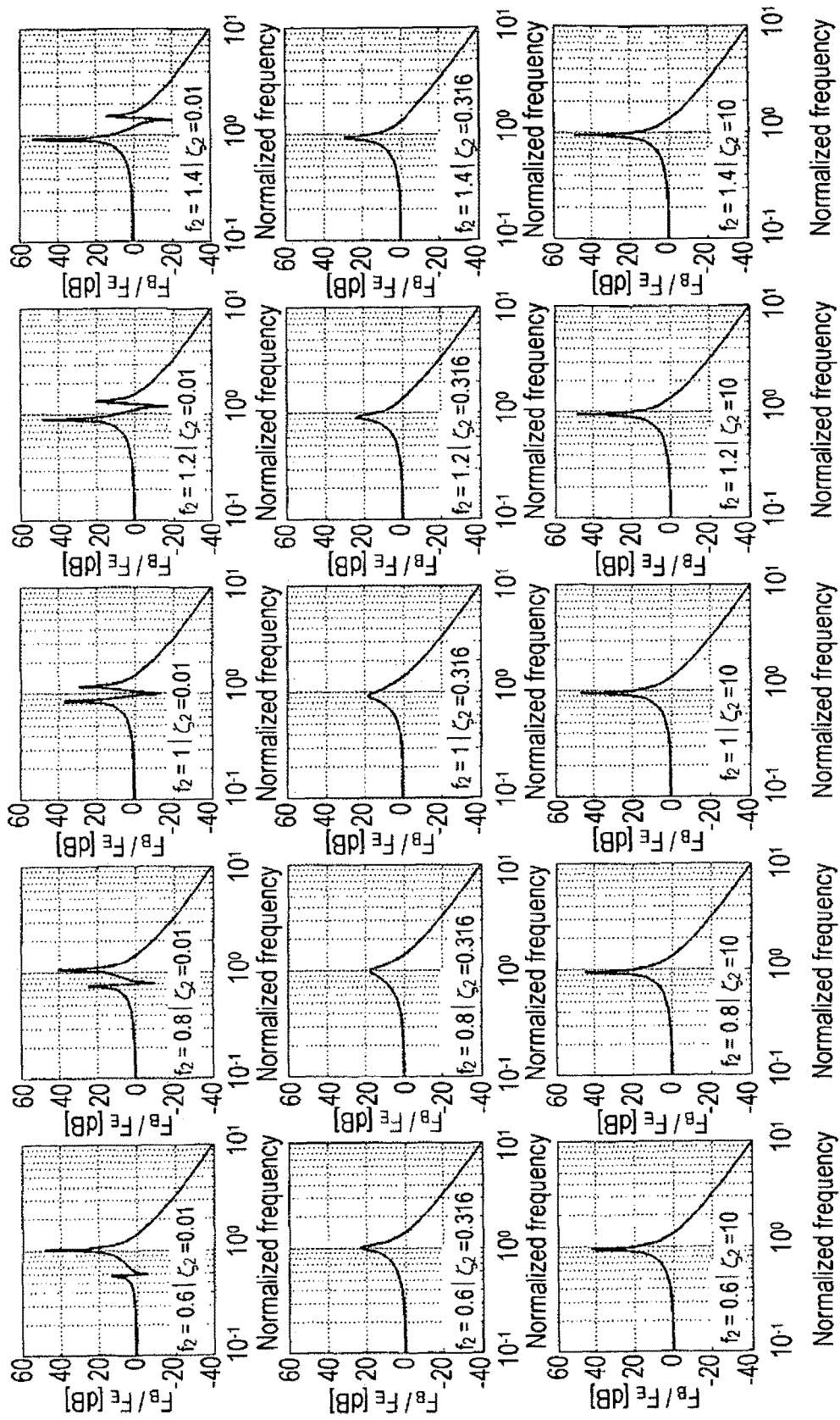
Figure 8:
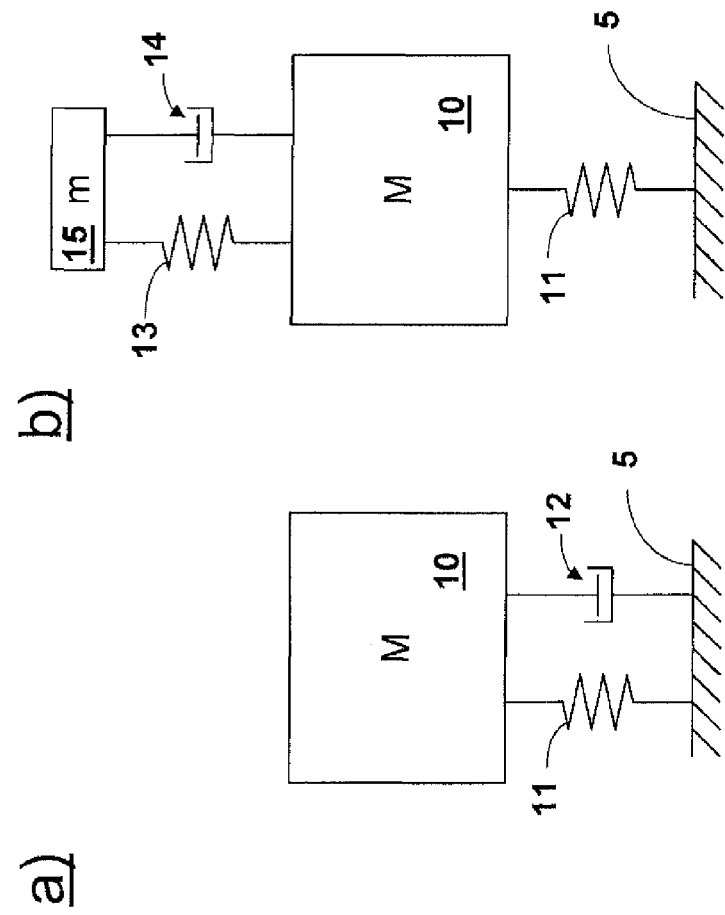
FIGS. 8a-b show schematic illustrations for elucidating conventional damping arrangements.

FIG. 6 shows a further embodiment of a damping arrangement 600 according to the present invention, wherein elements which are analogous or substantially functionally identical to FIG. 1 are in turn designated by reference numerals increased by "500". The damping arrangement 600 in accordance with FIG. 6 differs from the damping arrangement 500 in accordance with FIG. 5 in that the magnets 631, 632 embodied as ring magnets are each provided with a through-hole, through which an arbitrary element such as e.g. a pin of an actuator can extend. Such an element is merely indicated and designated by "640" in FIG. 6.

According to a further aspect, the disclosure also relates to a damping arrangement for dissipating oscillation energy of an element in a system, more particularly in a microlithographic projection exposure apparatus, comprising an absorber mass (215, 415, 515, 715), which is mounted via a stable mounting with respect to the element (110, 210, 310, 410, 510, 610, 710);

wherein the absorber mass (215, 415, 515, 715) is arranged in a cavity present within the element and is at least partly surrounded by a fluid (120, 220, 320, 420, 520, 620, 720) situated in the cavity;

wherein a mass-spring system is formed by the absorber mass (215, 415, 515, 715), the system damping a translational movement component of an oscillation of the element (110, 210, 310, 410, 510, 610, 710) that exists at the linking point of the absorber mass (215, 415, 515, 715); and wherein the absorber mass (215, 415, 515, 715) is formed by a magnet, which is suspended movably within the cavity.

According to a still further aspect, the disclosure also relates to a damping arrangement for dissipating oscillation energy of an element in a system, more particularly in a microlithographic projection exposure apparatus, comprising an absorber mass (115, 215, 315, 415, 515, 615, 715), which is mounted via a stable mounting with respect to the element (110, 210, 310, 410, 510, 610, 710);

wherein the absorber mass (115, 215, 315, 415, 515, 615, 715) is arranged in a cavity present within the element and is at least partly surrounded by a fluid (120, 220, 320, 420, 520, 620, 720) situated in the cavity;

wherein a mass-spring system is formed by the absorber mass (115, 215, 315, 415, 515, 615, 715), the system damping a translational movement component of an oscillation of the element (110, 210, 310, 410, 510, 610, 710) that exists at the linking point of the absorber mass (115, 215, 315, 415, 515, 615, 715); and wherein the element (110, 210, 310, 410, 510, 610, 710) is an actuator component.

Even though the invention has been described on the basis of specific embodiments, numerous variations and alternative embodiments, e.g. by combination and/or exchange of features of individual embodiments, are apparent to the person skilled in the art. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An arrangement, comprising:
a mirror having a cavity;
a rheological fluid in the cavity of the mirror; and
an absorber mass in the cavity of the mirror,
wherein:
the absorber mass is at least partly surrounded by the rheological fluid so that the absorber mass and the rheological fluid define a mass-spring system that is configured to dampen a translational movement component of an oscillation of the mirror that exists at a linking point of the absorber mass; and
the arrangement is configured to be used in a microlithographic projection exposure apparatus.

2. The arrangement of claim 1, wherein a resonant frequency of the mass-spring system differs by a maximum of one frequency decade from a resonant frequency of the mirror.

3. The arrangement of claim 1, wherein a resonant frequency of the mass-spring system differs by a maximum of a half frequency decade from a resonant frequency of the mirror.

4. The arrangement of claim 1, wherein the rheological fluid comprises a ferrofluid.

5. The arrangement of claim 4, wherein the ferrofluid stably mounts the absorber mass to the mirror.

6. The arrangement of claim 1, wherein the absorber mass is a magnet, and the absorber mass is movably suspended within the cavity of the mirror.

7. The arrangement of claim 1, further comprising a magnet.

8. The arrangement of claim 7, wherein the magnet is fixedly linked to the mirror.

9. The arrangement of claim 8, wherein the absorber mass comprises a nonmagnetic material.

10. The arrangement of claim 1, wherein the stable mounting of the absorber mass has a resonant frequency corresponding to a resonant frequency of the mirror.

11. The arrangement of claim 1, wherein the stable mounting comprises two separate bearings configured to elastically suspend the mirror in different degrees of freedom.

12. The arrangement of claim 11, wherein, for at least two different degrees of freedom, the mass-spring system has different resonant frequencies of damping and/or different degrees of damping.

13. The arrangement of claim 12, wherein a first bearing is configured to act in an axial direction relative to an axis of the mirror, and second bearing is configured to act in a radial direction relative to the axis of the mirror.

14. The arrangement of claim 1, wherein the rheological fluid comprises an electrically controllable rheological fluid.

15. The arrangement of claim 1, wherein the rheological fluid comprises a rheological fluid that is controllable by an electric field.

16. The arrangement of claim 1, wherein the rheological fluid comprises a rheological fluid that is controllable by a magnetic field.

17. The arrangement of claim 1, wherein the rheological fluid is completely contained within the cavity of the mirror, and the absorber mass is completely contained within the cavity in the mirror.

18. The arrangement of claim 1, further comprising a carrying structure configured so that the mirror and carrying structure define a second spring-mass system.

19. The arrangement of claim 1, wherein the mass-spring system is completely confined within the cavity of the mirror.

20. An apparatus, comprising:
an arrangement, comprising:
mirror having a cavity;
a rheological fluid that is in the cavity of the mirror; and
an absorber mass stably in the cavity of the mirror,
wherein:
the absorber mass is at least partly surrounded by the rheological fluid so that the absorber mass and the rheological fluid define a mass-spring system that is configured to dampen a translational movement component of an oscillation of the mirror that exists at a linking point of the absorber mass; and
the apparatus is a microlithographic projection exposure apparatus.

21. The apparatus of claim 20, wherein the arrangement comprises a magnet.

22. The apparatus of claim 20, wherein the projection exposure apparatus is designed for operation at an operating wavelength of less than 200 nm.

23. The apparatus of claim 20, wherein the projection exposure apparatus is designed for operation at an operating wavelength of less than 15 nm.

* * * * *